United States Patent [19]

Sutrina

[11] Patent Number: 4,562,512
[45] Date of Patent: Dec. 31, 1985

[54] MULTIPLE SEMICONDUCTOR CONTAINING PACKAGE HAVING A HEAT SINK CORE

[75] Inventor: Thomas Sutrina, Rockford, Ill.

[73] Assignee: Sundstrand Corporation, Rockford, Ill.

[21] Appl. No.: 633,647

[22] Filed: Jul. 23, 1984

[51] Int. Cl.⁴ .............................................. H05K 7/20
[52] U.S. Cl. ..................................... 361/386; 357/81; 165/76; 165/80.4
[58] Field of Search ................................ 361/382–388; 174/15 R, 16 HS; 357/81, 82; 165/80 B, 80 C, 80 D, 76; 363/141

[56] References Cited

U.S. PATENT DOCUMENTS

| | | | |
|---|---|---|---|
| 2,815,472 | 12/1957 | Jackson | 174/16 HS |
| 2,950,093 | 8/1960 | Krempel et al. | |
| 3,226,466 | 12/1965 | Martin | 174/16 HS |
| 3,364,987 | 1/1968 | Bylurd | 174/16 HS |
| 3,389,305 | 6/1968 | Bond | |
| 3,586,917 | 6/1971 | Oates | 361/385 |
| 3,727,114 | 4/1973 | Oshima | 165/80 B |
| 4,010,489 | 3/1977 | Bourbeau | 165/80 C |

Primary Examiner—G. P. Tolin
Attorney, Agent, or Firm—Wood, Dalton, Phillips, Mason & Rowe

[57] ABSTRACT

A semiconductor package includes a cubicle heat sink core. A pair of heat sink caps, each having a concave surface defined by three mutually perpendicular faces are provided. The caps substantially encapsulate the core while being spaced therefrom with each of the faces being generally parallel to a corresponding side of the core. Semiconductors are sandwiched between each side of the core and the associated parallel face and springs bias the cap towards each other and towards the core to provide the requisite thermal and electrical contact pressure.

13 Claims, 4 Drawing Figures

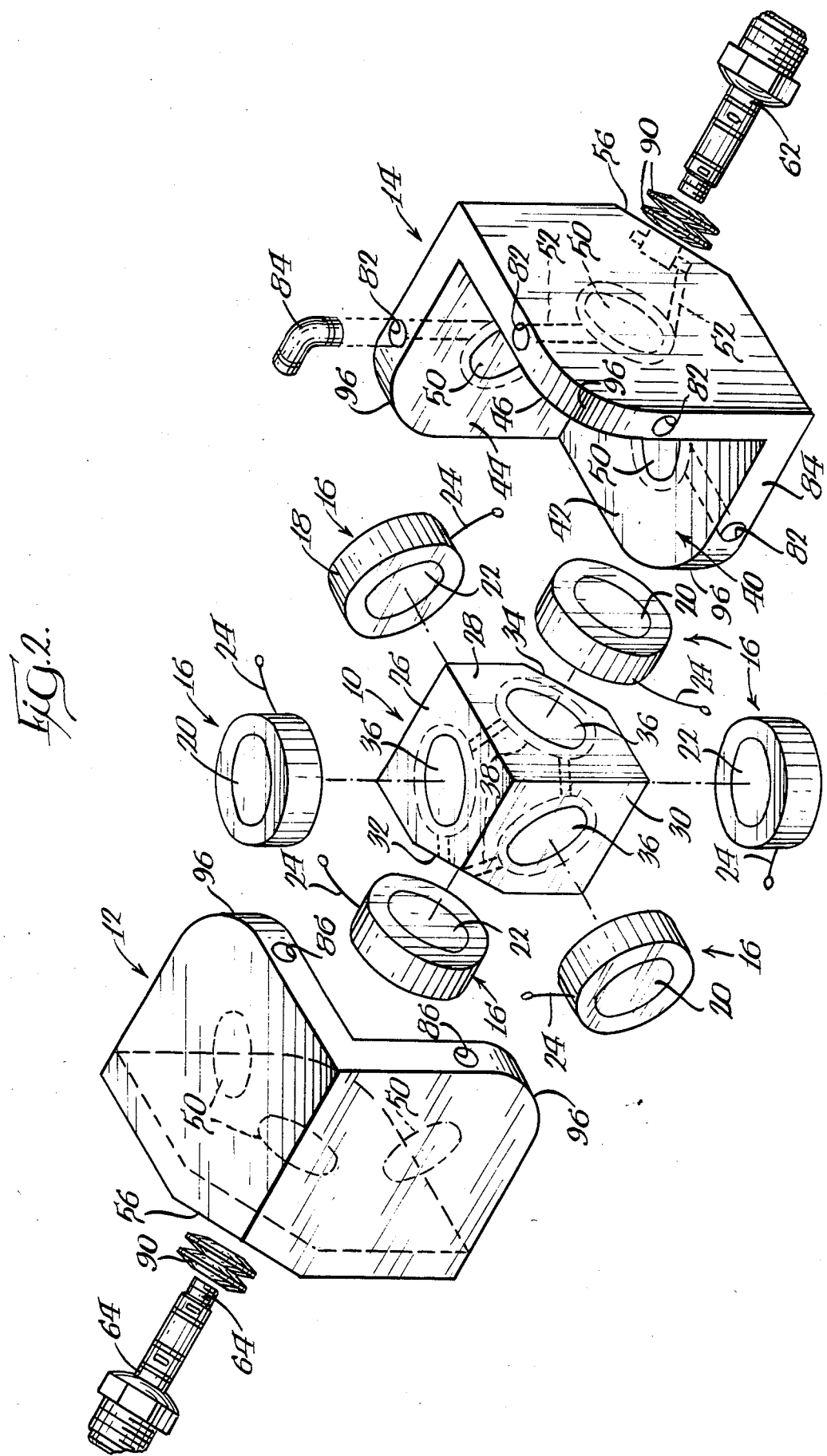

MULTIPLE SEMICONDUCTOR CONTAINING PACKAGE HAVING A HEAT SINK CORE

FIELD OF THE INVENTION

This invention relates to a package for semiconductors, and more particularly, to a package for a plurality of semiconductor elements as may be used for switching purposes.

BACKGROUND ART

Over the years a variety of packages have been developed for housing multiple semiconductor components. In general, it is desirable that such packages be relatively compact for space saving reasons and typically they are provided with some sort of means for cooling the package to dissipate heat generated therein.

Heat may be generated within a semiconductor package by either of two principal phenomena. Semiconductors are, by definition, variable resistors which of course generate heat when current passes through them. This provides one source of heat which must be dissipated.

Another source of heat is stored electrical energy within the package or associated circuit. When semiconductors are turned off, high voltage spikes are frequently generated by the stored energy which in turn is converted into heat and moreover, may limit switching capacity.

Thus, by minimizing stored energy in the system, the second source of heat may be minimized while at the same time increasing switching capacity. Such heat as is generated may be dissipated by cooling and it will be appreciated that, with a lesser amount of heat being generated, the size of the cooling system may be commensurately reduced thereby providing a more compact assembly and, according to the present invention, a decreased ability of the package to store energy capable of generating voltage spikes.

SUMMARY OF THE INVENTION

The principal object of the invention is to provide a new and improved semiconductor package. More specifically, it is an object of the invention to provide an extremely compact semiconductor package whereby system stored energy and response time are minimized to provide better performance.

An exemplary embodiment of the invention achieves the foregoing objects in a construction including a heat sink core having an external surface configuration of a geometric solid. Means are provided on the surface for defining a plurality of spaced semiconductor receiving points and at least two heat sink caps for substantially housing the core are provided. Each has a generally concave surface which in turn is generally complimentary to the portion of the surface of the core to be housed by the respective cap. A plurality of semiconductors greater than the number of the caps are located between the caps and the core and are individually disposed at respective ones of the receiving points. Means are provided for biasing the caps toward the core to assure good thermal and electrical conductivity between the semiconductor and the caps and the core.

According to one aspect of the invention, the receiving points are defined by flat surfaces.

In a highly preferred embodiment, the heat sink core is in the form of a cube and the caps are provided with concave surfaces defined by three mutually perpendicular faces. The biasing means act against external apexes of the caps so that equal pressure is applied through the caps to each of the semiconductors, each cap applying bias to three of the semiconductors.

At least one, typically all, of the core and the caps are provided with internal coolant passages having inlets and outlets. The system may include an inlet conduit and an outlet conduit, each slidably extending through a respective apex of one of the caps to connect to the coolant passages and affixed to the core. The biasing means may comprise springs surrounding an associated one of the conduits and engaging the corresponding cap at the apex thereof.

Other objects and advantages will become apparent from the following specification taken in connection with the accompanying drawings.

DESCRIPTION OF THE DRAWINGS

FIG. 2 is an exploded view of the semiconductor package;

DESCRIPTION OF THE PREFERRED EMBODIMENT

Figure 1:
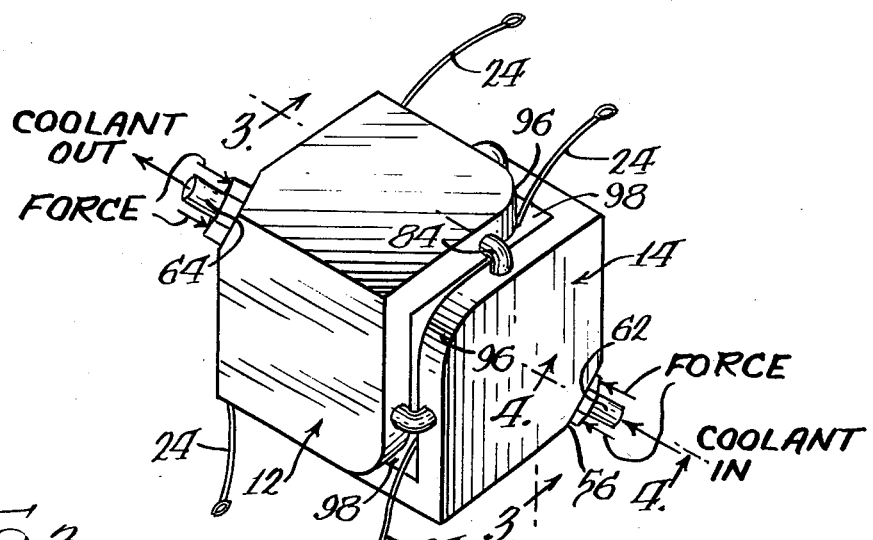
FIG. 1 is a perspective view of an assembled semiconductor package made according to the invention.

An exemplary embodiment of a semiconductor package made according to the invention is illustrated in the drawings and as seen in FIG. 1 has a generally cubicle exterior. However, the exterior shape need not be cubicle and will, in a large part, be dictated by the usual desire to minimize size and the amount of material employed in making up the package and the configuration of interior components.

Specifically, as seen in FIG. 2, the package includes a heat sink core, generally designated 10, at least two heat sink caps, generally designated 12 and 14, and a plurality of semiconductors, each generally designated 16. Addressing first the semiconductors 16, each is typically in a wafer form and may be surrounded, about its cylindrical axis, with a collar of an elastomeric insulating material 18 or the like. The semiconductor body itself includes opposed faces 20 and 22 forming electric contact points for differing components of the semiconductor, e.g., anode, cathode, gate, base, emitter, etc.

Where the semiconductors are other than diodes, they may also include a control lead 24 on which an electrical signal may be placed to provide appropriate control of the conductivity of the associated semiconductor 16 in a conventional fashion.

While the semiconductors 16 are illustrated as individually packaged, it will be appreciated by those skilled in the art that using conventional techniques, they may be employed in the present invention in unpackaged form if desired.

The heat sink core 10 has an external surface in the form of a geometric solid. In the preferred embodiment of the invention, the same is configured as a cube having six surfaces, three of which are shown at 26, 28, and 30. Two opposed corners or apexes of the core are beveled as at 32 and 34 for purposes to be seen. The beveled surfaces 32 and 34 will typically be transverse to the diagonal of the cube which they intersect.

Figure 3:
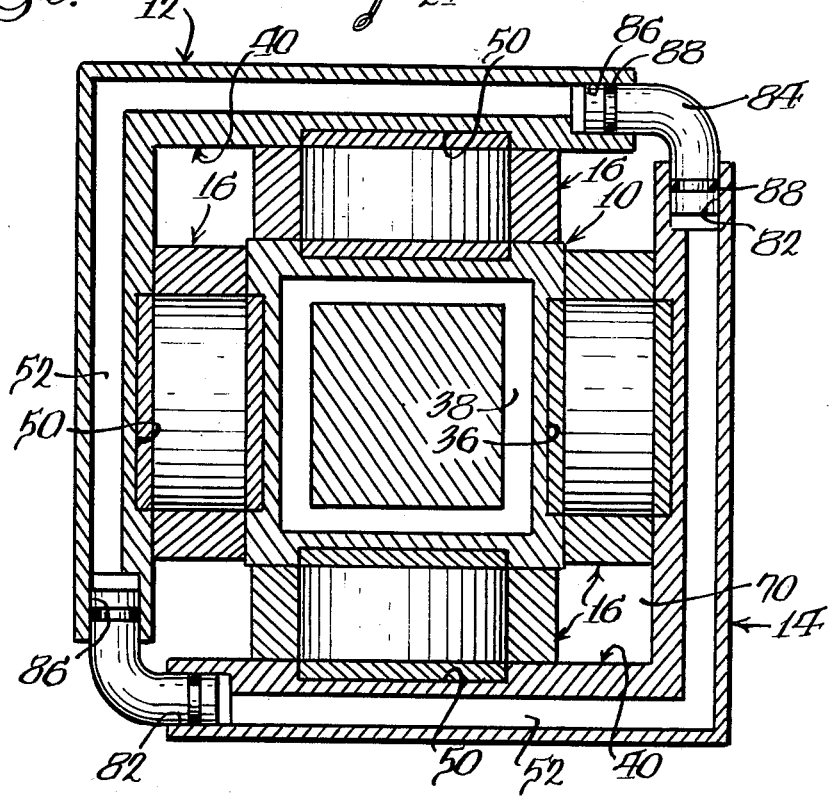
FIG. 3 is a view taken approximately along the line 3—3 in FIG. 1.
Figure 4:
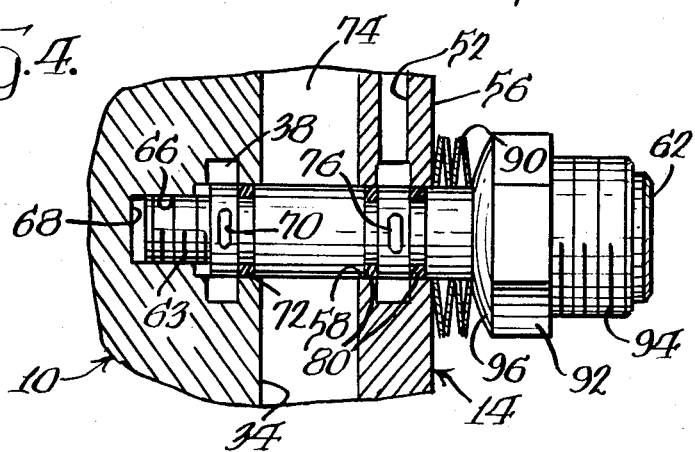
FIG. 4 is a sectional view taken approximately along the line 4—4 in FIG. 1.

Each of the six surfaces including the surfaces 26, 28 and 30 are provided with a circular recess 36 for receiving the face 22 of a corresponding one of the semiconductors 16. Additionally, as seen in FIGS. 2 and 3, the core 10 includes interconnected internal coolant passages 38 located in good heat exchange relation to each of the recesses 36. As seen in FIG. 2, the coolant passages 38 extend to the beveled surface 32 and a similar extension is provided to the beveled surface 34 as seen in FIG. 4.

The coolant passages may be formed in any suitable fashion as by being bored or through casting techniques during the formation of the core 10.

As seen in FIG. 1, the caps 12 and 14 are designed to substantially encapsulate or house the core 10. Each cap 12 and 14 has a concave surface, generally designated 40, which in turn is defined by three mutually perpendicular faces 42, 44 and 46. Of course, if a cubicle shape was not chosen for the shape of the core 10, a different relationship between the faces 42, 44 and 46 and even the number of such faces would be different since it is desirable that the faces defining the concave surface 40 be generally complimentary to surfaces on the core 10, keeping in mind the function of the caps 12 and 14 in housing the former.

Each of the faces 42, 44 and 46 is provided with a circular recess 50 which, when the caps are assembled to the remainder of the structure as illustrated in FIG. 1, are aligned with the recesses 36 in the core to receive the semiconductors 16 as illustrated in FIG. 3.

The caps 12 and 14 are also provided with internal interconnected coolant passages 52 in heat exchange relationship to the recesses 50.

As can be seen in FIGS. 1 and 2, at the apex opposite of the point of mutual perpendicularity of the faces 42, 44 and 46, the exterior of each cap 12 or 14 has a beveled surfaces 56 generally parallel to a corresponding one of the beveled surfaces 32 and 34. As seen in FIG. 4, which illustrates the cap 14, a bore 58 is located in the center of the beveled surface 56 and thus, is located medially or centrally of the corresponding cap 12 or 14. The bore 58 extends through the cap and intersects the coolant passages 52 at such location.

As seen in FIGS. 1 and 2, a coolant inlet conduit 62 is slidably disposed in the bore 58 associated with the cap 14 while an outlet conduit 64 is associated similarly with the other cap 12. As the arrangement of both conduits 62 and 64 with respect to the package is generally the same, only the conduit 62 will be described, and that in connection with FIG. 4. As seen therein, the conduit 62 terminates in a threaded end 63 received in an threaded portion 66 of a bore 68 located in the beveled surfaces 34 of the core 10. Immediately adjacent the threaded end 64, the conduit 62 is provided with one or more radially directed passages 70 which open to the coolant passages 38 in the core 10. O-ring seals 72 may be employed for sealing purposes at the location illustrated.

As can be seen in FIGS. 3 and 4, when the caps 12 and 14 are assembled to the core 10, they are separated by a space 74 due to the presence of the semiconductors 16. Spaced from the radial ports 70 a distance sufficiently so as to be located within the confines of the caps are radial ports 76 in the conduit 62 which are aligned with the coolant pages 52 in the caps. Again, O-ring seals 80 are provided as required.

As a consequence of this construction, coolant introduced through the conduit 62 is delivered to both the coolant passages 38 within the core 10 and the coolant passages 52 within the cap 14. Coolant within the passages 38 may exit the same via a connection identical to that illustrated in FIG. 4 to the outlet conduit 64. However, coolant within the cap 14 exits the same by openings 82 of the passages 52 to the edges 84 of the cap 14 adjacent the faces 42, 44 and 46. From this location, the coolant is directed to the passages 52 in the cap 12 by means of elbows 84 extending from the openings 82 to similar and aligned openings 86 in the cap 12 which connect with the passages 52 in the cap 12. Coolant within the cap 12 may then exit the same by a connection to the outlet conduit 64 identical to that illustrated in FIG. 4. O-ring seals 88 assure that the elbows 84 are sealed within both the openings 82 in the cap 14 and the openings 86 in the cap 12.

As is well known in the art, it is desirable to bias housing components for semiconductors in such a way as to firmly sandwich the semiconductors to establish good electrical and thermal contact. In the present invention, such biasing is achieved through the use of springs in the form of Belleville washers 90 disposed about each of the conduits 62 and 64 and abutting an associated one of the surfaces 56 at the apex of each cap 12 and 14. The degree of such bias may be regulated by means of a nut 92 threadably received on a threaded surface 94 of the associated conduit 62 or 64 and having a generally spherical surface 95 in abutment with the washers 90.

As a consequence of this construction, the conduits not only serve to provide a means of ingress and egress of cooling fluid to the package, but also as mounts for a biasing structure. Because of the unique location of the conduit on the apexes of the caps, it will be appreciated that a substantially equal biasing force is applied to each of the three semiconductors engaged by each of the caps to provide uniformity in pressure application thereto.

In the usual case, the facing corners 96 of each of the caps 12 and 14 will be rounded or otherwise relieved. As seen in FIG. 1, this results, when the components are assembled, in the existance of a small space 98 through which the control leads 24 of the semiconductors may be extended for connection into a circuit in which the device may be used.

From the foregoing, it will be appreciated that a seniconductor package made according to the invention provides high power capability through the use of at least six semiconductors while maximizing compactness. As a consequence, stored system energy is minimized due to the close proximity of the semiconductors to each other and the fact that other circuit components can be mounted in close proximity to the package itself. Consequently heat loading is minimized by this feature and yet, the full capacity of the semiconductors may be utilized due to cooling provided by the system described.

Where the semiconductors are to be connected in parallel, a suitable buss (not shown) may be connected through one of the openings 98 to the core 10 while a similar, non-illustrated buss, may be connected to one or both of the caps 12 and 14. It will be appreciated, however, that the invention is susceptible to use in other electrical configurations which may be achieved by suitably electrically isolating one or more faces of the core 10 and one or more faces of either or both of the caps 12 and 14, or isolating the caps 12 and 14 from each other.

I claim:

1. A semiconductor package comprising:

a heat sink core structure having the configuration of a geometric solid with a plurality of first faces defined by intersecting planes;

at least two heat sink caps, each having a generally concave surface provided by a plurality of second faces defined by intersecting planes, the total number of said second faces on said heat sink caps being equal to or less than the number of said first faces on said heat sink core structure, said caps being disposed about said core with said core nested in said concave surfaces, corresponding ones of said faces on said core structure and said caps being generally parallel and defining semiconductor receiving spaces; and a plurality of semiconductors sandwiched between said caps and said core, one in each said semiconductor space.

2. The semiconductor package of claim 1 wherein said core is generally cubical and said second faces in each said cap are defined by three mutually perpendicular planes; and there are six of said semiconductors and semiconductor receiving spaces.

3. The semiconductor package of claim 1 wherein each of said caps is provided with at least one internal coolant passage, and further including means interconnecting each said coolant passage at the interface of said caps.

4. The semiconductor package of claim 3 wherein said interconnecting means comprises at least one elbow.

5. The semiconductor package of claim 1 wherein said core includes at least one coolant passage terminating in an inlet and an outlet in opposed relation, one of said caps being centered on said inlet and another being centered on said outlet, inlet and outlet conduits affixed to said inlet and said outlet respectively and slidably extending through a respective one of said caps, and biasing means carried by each of said conduits and engaging the respective cap for urging the same toward said core.

6. The semiconductor of claim 5 wherein said conduits extend through apertures in the respective caps, and the caps each include at least one internal coolant passage opening to the associated aperture, each of said conduits including a passage in fluid communication with the internal coolant passage of the associated cap at the aperture therein, and means interconnecting the internal coolant passages of said caps.

7. A semiconductor package comprising:

a heat sink core having an external surface configuration of a geometric solid;

means on said surface defining a plurality of spaced semiconductor receiving points;

at least two heat sink caps for substantially housing said core, each having a generally concave surface generally complementary to the portion of the surface of the core to be housed by the respective cap;

a plurality greater than the number of said caps of semiconductors between said caps and said core and disposed at respective ones of said receiving points; and means for biasing said caps toward said core.

8. The semiconductor package of claim 7 wherein there are two said caps and at least six semiconductors and said biasing means are effective generally centrally of said caps.

9. The semiconductor package of claim 7 wherein each said receiving point is defined by a generally flat surface.

10. The semiconductor package of claim 4 wherein said core is configured as a reatangular solid.

11. A semiconductor package comprising:

a cubical heat sink core;

a pair of heat sink caps, each having a concave surface defined by three mutually perpendicular faces, said caps substantially encapsulating said core while being spaced therefrom with each of said faces being generally parallel to a corresponding side of said core;

a semiconductor sandwiched between each said side and the associated parallel face; and means holding said core, said caps and said semiconductors in assembled relation.

12. The semiconductor package of claim 11 wherein each of said caps has an apex on the side thereof opposite the point of mutual perpendicularity of said faces, and said holding means comprises a biasing means operative on each said apex.

13. The semiconductor package of claim 12 wherein at least one of said core and said caps includes an internal coolant passage, inlet and outlet conduits for said passage, on at each apex, and affixed to said core and slidably extending through the associated caps and the respective apex, said biasing means comprising springs disposed about said conduits and engaging the associated cap.

* * * * *